(12) United States Patent
Reill et al.

(10) Patent No.: US 8,890,306 B2
(45) Date of Patent: Nov. 18, 2014

(54) LIGHT-EMITTING DIODE

(75) Inventors: Joachim Reill, Zeitlarn (DE); Georg Bogner, Lappersdorf (DE); Stefan Grötsch, Bad Abbach (DE)

(73) Assignee: OSRAM Opto Semiconductor GmbH (DE)

( * ) Notice: Subject to any disclaimer, the term of this patent is extended or adjusted under 35 U.S.C. 154(b) by 0 days.

(21) Appl. No.: 13/808,300

(22) PCT Filed: May 24, 2011

(86) PCT No.: PCT/EP2011/058494
§ 371 (c)(1),
(2), (4) Date: Mar. 6, 2013

(87) PCT Pub. No.: WO2012/004049
PCT Pub. Date: Jan. 12, 2012

(65) Prior Publication Data
US 2013/0207133 A1  Aug. 15, 2013

(30) Foreign Application Priority Data
Jul. 7, 2010  (DE) .......................... 10 2010 026 344

(51) Int. Cl.
*H01L 23/15* (2006.01)
*H01L 23/08* (2006.01)
(Continued)

(52) U.S. Cl.
CPC .......... *H01L 33/644* (2013.01); *H01L 25/0753* (2013.01); *H05K 1/05* (2013.01); *H01L*
(Continued)

(58) Field of Classification Search
CPC .... H01L 25/0753; H01L 33/644; H01I 33/62; H05K 1/0203; H05K 1/05; H05K 2201/10106
USPC ........ 438/22, 26–29, 34, 38–39, 42, 438/106–112, 118–119, 121–127; 257/79, 257/88, 93, 98–100, 666, 675–678, 690, 257/697–699, 706, 708–712, 718–720, 257/723–725, 731–733, E23.101, E23.103, 257/E33.001
See application file for complete search history.

(56) References Cited

U.S. PATENT DOCUMENTS 3,938,178 A * 2/1976 Miura et al. .................. 257/590
6,674,097 B2 * 1/2004 Komoto et al. ................ 257/98
(Continued)

FOREIGN PATENT DOCUMENTS

DE  102 45 946 C1  10/2003
EP  1 843 394 A2  10/2007
(Continued)

OTHER PUBLICATIONS

"Improved thermal management of GaN/sapphire light-emitting diodes embedded in reflective heat spreaders", R. H. Horng, C. C. Chiang, H. Y. Hsiao, X. Zheng, D. S. Wuu, and H. I. Lin, Applied Physics Letters 93, 111907 (2008).*
(Continued)

*Primary Examiner* — Laura Menz
*Assistant Examiner* — Maliheh Malek
(74) *Attorney, Agent, or Firm* — DLA Piper LLP (US)

(57) ABSTRACT

A light-emitting diode includes a carrier with a mounting face and includes a metallic basic body and at least two light-emitting diode chips affixed to the carrier at least indirectly at the mounting face, wherein an outer face of the metallic basic body includes the mounting face, the at least two light-emitting diode chips connect in parallel with one another, the at least two light-emitting diode chips are embedded in a reflective coating, the reflective coating covering the mounting face and side faces of the light-emitting diode chips, and the light-emitting diode chips protrude with their radiation exit surfaces out of the reflective coating, and the radiation exit surfaces face away from the carrier.

10 Claims, 3 Drawing Sheets

(51) Int. Cl.
  *H01L 33/64* (2010.01)
  *H01L 25/075* (2006.01)
  *H05K 1/02* (2006.01)
  H01L 23/10 (2006.01)
  H05K 1/05 (2006.01)
  H01L 33/62 (2010.01)

(52) U.S. Cl.
  CPC ............. 2224/48227 (2013.01); *H01L 33/62* (2013.01); *H05K 2201/10106* (2013.01); *H01L 2224/48091* (2013.01); *H05K 2201/10409* (2013.01); *H05K 1/0203* (2013.01)
  USPC ............. 257/699; 257/88; 257/93; 257/99; 257/675; 257/708; 257/709; 257/724; 257/E23.101; 257/E33.001; 438/28; 438/34; 438/111; 438/122

(56) References Cited

U.S. PATENT DOCUMENTS

| | | | |
|---|---|---|---|
| 7,420,218 B2* | 9/2008 | Nagai | 257/98 |
| 7,745,832 B2* | 6/2010 | Hsieh et al. | 257/79 |
| 8,053,787 B2* | 11/2011 | Shiau | 257/81 |
| 8,278,681 B2* | 10/2012 | Lee et al. | 257/100 |
| 8,409,930 B2* | 4/2013 | Terui et al. | 438/122 |
| 8,535,985 B2* | 9/2013 | Lin et al. | 438/122 |
| 2002/0021871 A1* | 2/2002 | Auburger et al. | 385/88 |
| 2002/0079506 A1* | 6/2002 | Komoto et al. | 257/99 |
| 2003/0081384 A1* | 5/2003 | Rider et al. | 361/704 |
| 2003/0189830 A1 | 10/2003 | Sugimoto et al. | |
| 2004/0079941 A1* | 4/2004 | Yamazaki et al. | 257/40 |
| 2006/0128059 A1* | 6/2006 | Ahn et al. | 438/108 |
| 2007/0052067 A1 | 3/2007 | Umemoto | |
| 2007/0228386 A1* | 10/2007 | Shie et al. | 257/79 |
| 2007/0228516 A1 | 10/2007 | Plank et al. | |
| 2008/0203897 A1 | 8/2008 | De Samber et al. | |
| 2008/0231169 A1* | 9/2008 | Hata et al. | 313/500 |
| 2008/0303038 A1* | 12/2008 | Grotsch et al. | 257/88 |
| 2009/0001490 A1 | 1/2009 | Bogner et al. | |
| 2009/0050907 A1* | 2/2009 | Yuan et al. | 257/88 |
| 2009/0052178 A1 | 2/2009 | Marchl et al. | |
| 2009/0066877 A1 | 3/2009 | Abe et al. | |
| 2009/0225544 A1 | 9/2009 | Suzuki et al. | |
| 2009/0278139 A1 | 11/2009 | Fjelstad | |
| 2010/0027261 A1* | 2/2010 | Yashima et al. | 362/249.02 |
| 2010/0044746 A1* | 2/2010 | Steenbruggen | 257/99 |
| 2010/0140648 A1 | 6/2010 | Harada et al. | |
| 2010/0140780 A1* | 6/2010 | Huang et al. | 257/690 |
| 2010/0181589 A1* | 7/2010 | Huang et al. | 257/98 |
| 2010/0213479 A1* | 8/2010 | Li et al. | 257/98 |
| 2010/0224858 A1* | 9/2010 | Tu et al. | 257/13 |
| 2010/0258827 A1* | 10/2010 | Lee et al. | 257/98 |
| 2010/0283064 A1* | 11/2010 | Samuelson et al. | 257/88 |
| 2011/0042699 A1* | 2/2011 | Park et al. | 257/98 |
| 2011/0057205 A1* | 3/2011 | Mueller et al. | 257/84 |
| 2011/0062464 A1 | 3/2011 | Gerhard | |
| 2011/0278627 A1* | 11/2011 | Kim et al. | 257/98 |
| 2011/0284887 A1* | 11/2011 | Wu et al. | 257/91 |
| 2011/0303945 A1* | 12/2011 | Zitzlsperger et al. | 257/99 |
| 2012/0153316 A1* | 6/2012 | Helbing | 257/88 |
| 2012/0199843 A1* | 8/2012 | Heikman et al. | 257/76 |
| 2012/0223416 A1* | 9/2012 | Scheubeck et al. | 257/603 |
| 2012/0241781 A1* | 9/2012 | Yuan et al. | 257/89 |
| 2012/0319573 A1* | 12/2012 | Shi | 313/512 |
| 2012/0322178 A1 | 12/2012 | Guenther et al. | 438/26 |
| 2013/0069089 A1* | 3/2013 | Hussell et al. | 257/88 |
| 2013/0207247 A1* | 8/2013 | Pagaila et al. | 257/659 |
| 2013/0241040 A1* | 9/2013 | Tojo et al. | 257/666 |
| 2013/0252357 A1* | 9/2013 | Lin | 438/26 |
| 2013/0299982 A1* | 11/2013 | Pagaila et al. | 257/738 |

FOREIGN PATENT DOCUMENTS

| | | |
|---|---|---|
| TW | 200702823 | 1/2007 |
| TW | 200711068 | 3/2007 |
| TW | 200711099 | 3/2007 |
| TW | 200731562 | 8/2007 |
| TW | 200924218 | 6/2009 |
| WO | 2004/068596 A1 | 8/2004 |
| WO | 2005/008791 A2 | 1/2005 |
| WO | 2006/012842 A2 | 2/2006 |
| WO | 2006/089512 A1 | 8/2006 |
| WO | 2009/075530 A2 | 6/2009 |
| WO | 2009/138374 A1 | 11/2009 |

OTHER PUBLICATIONS

Xumin Shao et al., "Research of heat dissipation of RGB-LED backlighting system on LCD," 2009 7th IEEE International Conference on Industrial Informatics (INDIN 2009), Cardiff, UK, Jun. 23-26, 2009, pp. 807-812.

The Taiwanese Examination Report dated Jan. 22, 2014 for corresponding Taiwanese Application No. 100122157.

* cited by examiner

LIGHT-EMITTING DIODE

RELATED APPLICATIONS

This is a §371 of International Application No. PCT/EP2011/058494, with an international filing date of May 24, 2011 (WO 2012/004049 A1, published Jan. 12, 2012), which is based on German Patent Application No. 10 2010 026 344,3, filed Jul. 7, 2010, the subject matter of which is incorporated herein by reference.

TECHNICAL FIELD

This disclosure relates to a light-emitting diode.

BACKGROUND

WO 2006/012842 describes a light-emitting module.

When using light-emitting diodes in motor vehicle headlamps, dissipation of heat generated by the light-emitting diodes daring operation is often problematic. Accordingly, it could be helpful to provide a light-emitting diode which is particularly well suited for use in a motor vehicle headlamp.

SUMMARY

We provide a light-emitting diode including a carrier with a mounting face and including a metallic basic body and at least two light-emitting diode chips affixed to the carrier at least indirectly at the mounting face, wherein an outer face of the metallic basic body includes the mounting face, the at least two light-emitting diode chips connect in parallel with one another, the at least two light-emitting diode chips are embedded in a reflective coating, the reflective coating covering the mounting face and side faces of the light-emitting diode chips, and the light-emitting diode chips protrude with their radiation exit surfaces out of the reflective coating and the radiation exit surfaces face away from the carrier.

We also provide a light-emitting diode including a carrier with a mounting face and at least two light-emitting diode chips affixed to the carrier at least indirectly at the mounting face, wherein the carrier includes a metallic basic body, an outer face of the metallic basic body includes the mounting face, the at least two light-emitting diode chips are connected in parallel with one another, the at least two light-emitting diode chips are embedded in a reflective coating, the reflective coating covers the mounting face and side faces of the light-emitting diode chips, and the reflective coating terminates flush with radiation exit surfaces of the light-emitting diode chips facing away from the carrier.

We further provide a light-emitting diode including a carrier with a mounting face and at least two light-emitting diode chips affixed to the carrier at the mounting face, wherein the carrier includes a metallic basic body, an outer face of the metallic basic body includes the mounting face, the at least two light-emitting diode chips are connected in parallel with one another, the mounting face is arranged on an upper side of the carrier, the light-emitting diode chips are directly affixed to the carrier at the mounting face, the light-emitting diode chips electrically conductively connect to the metallic basic body, the light-emitting diode chips connect in parallel with one another via the metallic basic body, an electrically insulating layer is affixed to the carrier on a lower side of the carrier, and the electrically insulating layer has a thermal conductivity of at least 2 W/(mK).

DETAILED DESCRIPTION

Figure 1:
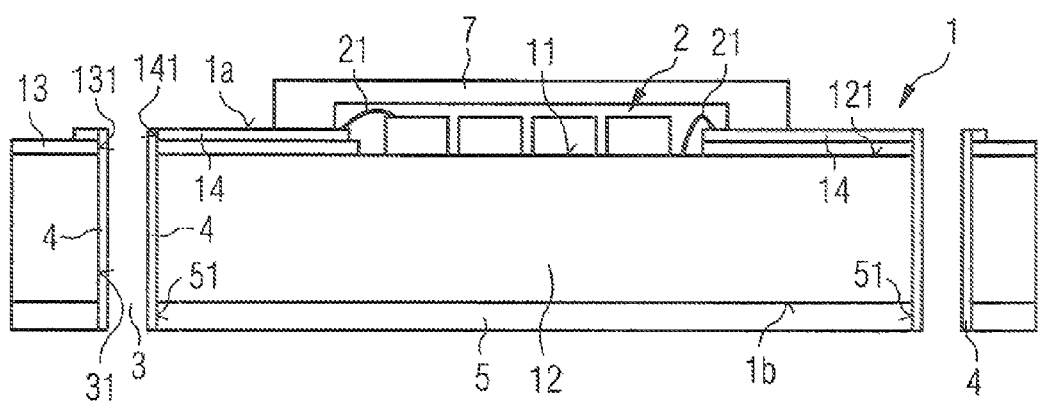
FIGS. 1, 2, 3 and 4 show examples of light-emitting diodes using schematic sectional illustrations.

The light-emitting diode may comprise a carrier. The carrier may be in the form of a plate, for example. That is to say that the lateral extent of the carrier is great in comparison with its thickness. The carrier has a mounting face provided to accommodate components of the light-emitting diode.

The light-emitting diode may comprise at least two light-emitting diode chips. The light-emitting diode preferably comprises a large number of light-emitting diode chips, for example, four or more light-emitting diode chips. The light-emitting diode chips of the light-emitting diode are provided for the purpose of generating electromagnetic radiation in the frequency band of infrared radiation to UV radiation during operation. The light-emitting diode chips in this ease represent the light sources of the light-emitting diode. Preferably, the light-emitting diode itself emits white light.

The at least two light-emitting diode chips, preferably all of the light-emitting diode chips of the light-emitting diode, may be affixed to the carrier at least indirectly at the mounting face. "At least indirectly" means that it is possible for there to be further material such as an intermediate carrier or a connector, for example, an adhesive or solder between the light-emitting diode chips and the mounting face.

The carrier may have a metallic basic body. Preferably, the metallic basic body then forms the main part of the carrier. For example, the metallic basic body accounts for at least 90% of the volume and at least 90% of the weight of the carrier. The metallic basic body is formed with a metal with good electrical and thermal conductivity such as copper, for example.

The metallic basic body comprises an outer face comprising the mounting face of the carrier. That is to say that at least points of the outer face of the metallic basic body of the carrier form the mounting thee, at which the at least two light-emitting diode chips are affixed at least indirectly to the carrier.

The at least two light-emitting diode chips, preferably all of the light-emitting diode chips of the light-emitting diode, connect electrically in parallel with one another.

The light-emitting diode may comprise a carrier with a mounting face and at least two light-emitting diode chips affixed to the carrier at least indirectly at the mounting face. In this case, the carrier comprises a metallic basic body which has an outer face which comprises the mounting face of the carrier. The at least two light-emitting diode chips of the light-emitting diode are in this case connected in parallel with one another.

The light-emitting diode described here is based on the idea, inter alia, that the arrangement of the light-emitting diode chips of the light-emitting diode as close as possible to a metallic basic body enables particularly efficient spreading of the heat generated by the light-emitting diode chips during operation of the light-emitting diodes. That is to say that the heat generated by the light-emitting diode chips is distributed over the entire volume of the metallic basic body which forms a main part of the carrier as soon as possible after the generation of the heat.

The light-emitting diode may comprise at least one opening in the carrier. The opening in this case extends from an upper side of the carrier to a lower side of the carrier, the lower side facing away from the upper side. For example, the opening extends from a top face of the carrier to a bottom face of the carrier. The opening passes through the carrier preferably completely. The opening can be in the form of a bore in the carrier, for example, or the opening is already provided during manufacture of the carrier. The opening has an inner face in which the material of the carrier adjoins the opening. In this case, the inner face is covered by an electrically insulating material. For example, the entire inner face of the opening is coated with the electrically insulating material, with the result that there is no point within the opening at which material of the carrier is exposed.

For example, the opening is used to accommodate a fixing device to mount the light-emitting diode. For example, the fixing device may be a screw or a locating pin for a press fit.

The electrically insulating material used to cover the inner face of the opening is, for example, an electrically insulating plastic or a layer formed by an electrically insulating material such as silicon dioxide or silicon nitride. In addition, the electrically insulating material can be ceramic. The electrically insulating material can contain a boron nitride or consist of a boron nitride, for example. The electrically insulating material can cover the side face or the side faces of the opening completely in the form of a layer. The electrically insulating material can be applied with a thickness of 30 µm to 100 µm, for example.

The light-emitting diode can comprise a plurality of openings, for example, two or more openings in the carrier. Each of the openings is then configured in the described manner and is used to accommodate a fixing device to mount the light-emitting diode at the intended use location.

The opening may pass through the metallic basic body completely. That is to say that the at least one opening is formed in the carrier in the region of the metallic basic body. The inner face of the opening is then preferably covered completely by the electrically insulating material at least in the region of the metallic basic body. That is to say that the metallic basic body is not exposed at any point of the opening and can therefore be kept free of potential in a simple manner during operation of the light-emitting diode.

The mounting face of the carrier may be arranged on the upper side of the carrier and the light-emitting diode chips are affixed to the carrier directly at the mounting face. For example, the light-emitting diode chips are in this case soldered onto the carrier at the mounting face. In other words, the light-emitting diode chips are applied directly to the metallic basic body of the carrier and in direct contact therewith, apart from a connector such as the solder, for example. Then, an electrically insulating layer is affixed to the carrier on the lower side of the carrier, i.e., on the side of the carrier which faces away from the mounting face. The electrically insulating layer is preferably in direct contact with the metallic basic body. The electrically insulating layer covers the carrier on its lower side preferably completely, apart from the openings. That is to say that the metallic basic body is then also covered completely by the electrically insulating layer on its side facing away from the mounting face.

The electrically insulating layer in this case has a thermal conductivity of at least 2 W/(mK).

In other words, in this example, the light-emitting diode chips are mounted directly on the metallic basic body which enables optimum thermal coupling of the light-emitting diode chips to the carrier. The entire metallic basic body of the carrier acts as a heat-spreading element. In this case, the light-emitting diode chips can be electrically conductively connected to the metallic basic body and connected in parallel with one another via the metallic basic body. The electrical insulation of the metallic basic body is formed on the side facing away from the mounting face by the electrically insulating layer which is characterized by particularly high thermal conductivity. This design of the light-emitting diode enables early spreading of heat directly at the heat source, i.e., the light-emitting diode chips and, thus, a particularly low thermal resistivity of the entire light-emitting diode.

The electrically insulating layer may be a ceramic layer. This means that the electrically insulating layer may have ceramic properties. The electrically insulating layer can then contain a ceramic material or consist of a ceramic material. The electrically insulating layer in this case has a thermal conductivity of at least 2 W/(mK).

The electrically insulating layer may have a thickness of 30 µm to 100 µm. For example, the electrically insulating layer has a thickness of 50 µm to 70 µm.

The electrically insulating layer may contain boron nitride or consist of boron nitride. In this case, the electrically insulating, layer can have a thickness of 30 µm to 100 µm, for example, of 50 µm to 70 µm. The electrically insulating layer in this case has a thermal conductivity of at least 2 W/(mK).

The light-emitting diode chips may be electrically conductively connected to the metallic basic body and connected in parallel with one another via the metallic basic body. That is to say that the light-emitting diode chips may then be at the same electrical potential as the metallic basic body on that side of the light-emitting diode chips which faces the metallic basic body.

The opening may pass through the electrically insulating layer on the lower side of the carrier completely. That is to say that the electrically insulating layer is also interrupted by the opening. In this case, the opening can be produced before or after the electrically insulating layer is applied to the metallic basic body. A side face of the electrically insulating layer in the opening is preferably covered by the electrically insulating material with which the inner face is also covered in the region of the metallic basic body. For example, for this purpose, the inner face of the opening is only coated with the electrically insulating material once the electrically insulating layer has been applied on the lower side of the carrier. In this case, it is also possible for the electrically insulating layer on the lower side of the carrier to be formed with the same material, i.e., the electrically insulating material.

An intermediate carrier to which the light-emitting diode chips are affixed may be arranged between the light-emitting diode chips and the mounting face. The intermediate carrier can comprise a ceramic material or consist of a ceramic material. That is to say that the intermediate carrier then represents electrical insulation of the light-emitting diode chips with respect to the carrier and therefore in particular with respect to the metallic basic body. In this case, the electrically insulating layer on the lower side of the carrier can also be dispensed with.

The carrier may comprise a further electrically insulating layer affixed to the metallic basic body on the side facing the light-emitting diode chips. An electrically conductive layer to which the light-emitting diode chips are electrically conductively connected is then arranged on that side of the further electrically insulating layer which faces away from the metallic basic body. The electrically conductive layer can in this case be structured to form conductor tracks which make contact between the light-emitting diode chips of the light-emitting diode.

The opening may pass through the further electrically insulating layer and the electrically conductive layer completely. In this case, side faces of the further electrically insulating layer and the electrically conductive layer in the opening are covered by the electrically insulating material. That is to say that, in this example, preferably the entire inner face of the opening is covered by the electrically insulating material. With the exception of the metallic basic body, the further electrically insulating layer and the electrically conductive layer are also covered by the electrically insulating material and thus electrically insulated with respect to the fixing device in the opening.

The at least two light-emitting diode chips of the light-emitting diode may be embedded in a reflective coating. Preferably, all of the light-emitting diode chips of the light-emitting diode are embedded in the reflective coating.

"Embedded" means that the reflective coating covers at least points of the light-emitting diode chips and is in direct contact with the light-emitting diode chips at the covering locations. For example, it is possible for the reflective coating to terminate flash with a radiation exit surface of the light-emitting diode chips which faces away from the carrier. Those side faces of the light-emitting diode chips which run transversely with respect to the mounting face can then be covered completely, for example, by the reflective coating.

Furthermore, it is also possible for the reflective coating to cover the radiation exit surface of the light-emitting diode chips facing away from the mounting face. The reflective coating then has a small thickness there such that light generated in the light-emitting diode chips during operation can pass to the outside through the reflective coating. At the radiation exit surfaces of the light-emitting diode chips, the reflective coating then acts as a diffusing layer which diffuses the light passing through.

The reflective coating preferably also covers at least parts of the mounting face in addition to the light-emitting diode chips. For example, the mounting face is covered completely by the material of the reflective coating completely at exposed points, i.e., in particular where there is no light-emitting diode chip. In particular, it is also possible for the entire carrier to be covered by the reflective coating on its surface facing the light-emitting diode chips. That is to say that all of the exposed regions of the carrier at this surface are then covered by the reflective coating.

In this case, it is in particular possible for the reflective coating to appear to be white to a viewer when illuminated with daylight, for example. That is to say that the light-emitting diode itself can appear to be white when covered in a suitable manner by the reflective coating, i.e., when, for example, all of the exposed faces of the carrier at the surface facing the light-emitting diode chips are covered by the reflective coating.

in this case, the reflective coating is diffusely reflective, for example. The reflective coating can be formed by a matrix material. The matrix material can contain a silicone, for example, or consist of a silicone. In addition, it is possible for the matrix material to be a mixture of a silicone with an epoxide, i.e., a so-called "silicone-epoxide hybrid" material. Reflective particles can be introduced into the matrix material of the reflective coating. The reflective particles are formed, for example, by one of the following materials. i.e., they can consist of one of the following materials: $TiO_2$, $BaSO_4$, $ZnO$, $Al_xO_y$, $ZrO_2$. In particular, radiation-reflecting particles formed with $ZrO_2$ are particularly well suited to reflect blue or ultraviolet light.

In particular, it is also possible for the reflective coating in the matrix material to contain a mixture of different reflective particles formed by different materials from among those mentioned. In this way, the reflection spectrum of the reflective coating can be matched particularly well to the requirements of the light-emitting diode.

The light-emitting diode described here will be explained in more detail below with reference to examples and the associated Drawings.

Identical, similar or functionally identical elements have been provided with the same reference symbols in the Drawings. The Drawings and the size ratios of the elements illustrated therein with respect to one another should not be considered as being to scale. Instead, individual elements may be illustrated as being excessively large for reasons of improved representation and/or better understanding.

FIG. 1 shows a schematic sectional illustration of a first example of a light-emitting diode. The light-emitting diode comprises a carrier 1. The carrier 1 comprises a metallic basic body 12 forming the main part of the carrier. In this ease, the metallic basic body 12 accounts for at least 95% of the volume and the weight of the carrier. The metallic basic body is formed with copper, for example. Le., it contains copper or consists of copper.

The carrier 1 comprises a further electrically insulating layer 13 applied to points of the outer face 121 of the metallic basic body 12 on the upper side la of the carrier. The further electrically insulating layer 13 can in this ease be in direct contact with the metallic basic body 12. An electrically conductive layer 14 structured to form conductor tracks, for example, is applied to that side of the further electrically insulating layer 13 facing away from the metallic basic body 12.

The carrier 1 has openings 3 passing through the carrier, i.e., the metallic basic body 12, the further electrically insulating layer 13 and the electrically conductive layer 14, completely from the upper side 1a of the carrier 1 to the lower side 1b of the carrier 1.

Inner faces 31 of each opening 3 are in this case covered completely by the electrically insulating material 4. That is to say that the electrically insulating material 4 covers side faces of the metallic basic body 12, side faces 131 of the further electrically insulating layer and side faces 141 of the electrically conductive layer.

Each opening is used to accommodate a fixing device 8, for example, a screw. The fixing device 8 is in this ease provided to mount the light-emitting diode (see also FIG. 3 for the fixing device 8).

in the example shown in FIG. 1, light-emitting diode chips 2 arc applied, for example, soldered, directly to the metallic basic body 12 at the mourning face 11 of the carrier 1 The light-emitting diode chips 2 in this case connect in parallel with one another and are at the same electrical potential as the metallic basic body 12 on that side of the light-emitting diode chips facing the metallic basic body 12.

The light-emitting diode chips 2 electrically conductively connect to the electrically conductive layer 14 structured to form conductor tracks by bonding wires 21. It is possible here for one of the bonding wires 21 to electrically conductively connect directly to the metallic basic body 12. For example, the light-emitting diode comprises four light-emitting diode chips provided to generate blue light and/or UV radiation during operation. A luminescence conversion material is then arranged downstream of each light-emitting diode chip 2 or all of the light-emitting, diode chips 2 together, the luminescence conversion material converting at least some of the electromagnetic radiation generated by the light-emitting diode chips 2 during operation such that, overall, white light is emitted by the light-emitting diode.

In the example shown in FIG. 1, a cover 7 mechanically fixedly connected to the carrier 1, is arranged downstream of all of the light-emitting diode chips 2. The cover 7 may be a cover consisting of glass, for example. In addition, it is possible for the cover 7 to contain particles of a ceramic luminescence conversion material or to consist of a ceramic luminescence conversion material.

On the lower side of the carrier 1 facing away from the light-emitting diode chips 2, the electrically insulating layer 5 is preferably applied directly to the metallic, basic body 12, the electrically insulating layer electrically insulating the carrier 1. Side faces 51 of the electrically insulating layer can he covered by the electrically insulating material 4 in the region of the openings 3 which pass through the electrically insulating layer 5 completely. In this case, it is also possible for the electrically insulating material 4 and the electrically insulating, layer 5 to be formed with the same material.

Figure 2:
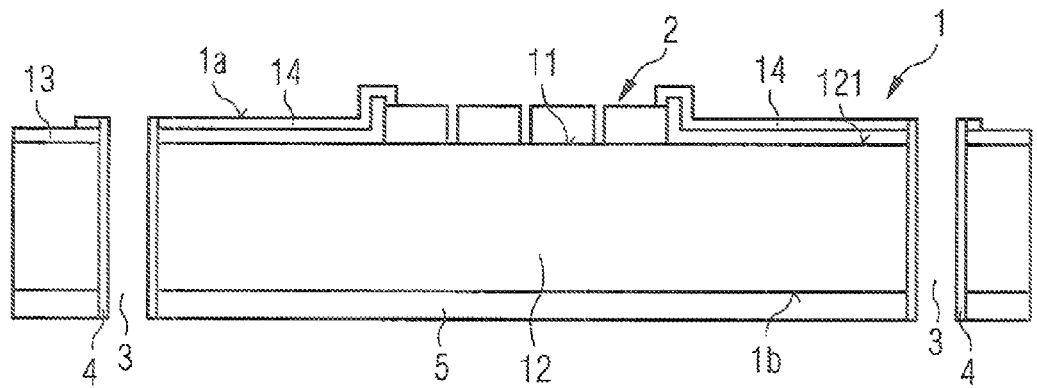

In connection with FIG. 2, a second example of a light-emitting diode will be explained in more detail with reference to a schematic sectional illustration, in contrast to the example shown in FIG. 1. In this example contact is made with the light-emitting diode chips 2 via the electrically conductive layer 14 structured to form conductor tracks. For this purpose, the electrically conductive layer 14 directly contacts with connection points (not shown) of the light-emitting diode chips 2. In the example shown in FIG. 2, the further electrically insulating layer 13 for this purpose covers at least the side faces of some light-emitting diode chips of the light-emitting diode at certain points. The electrically conductive layer 14 passes along the electrically insulating layer 13 at side faces of these light-emitting diode chips 2 to the electrical connection points of the light-emitting diode chips 2.

Figure 3:
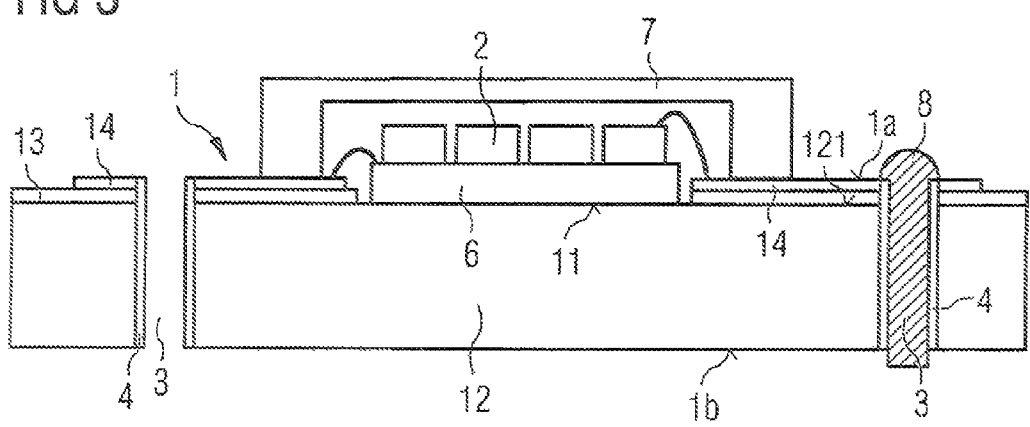

In connection with FIG. 3, a third example of a light-emitting diode is explained in more detail with reference to a schematic sectional illustration. In this example, in contrast to FIG. 1, there is no electrically insulating layer 5. The light-emitting diode chips 2 are electrically insulated from the metallic basic body 12 of the carrier 1 via an electrically insulating intermediate carrier 6 arranged between the metallic basic body 12 and the light-emitting diode chips 2. The intermediate carrier 6 consists of a ceramic material, for example. On that site of the intermediate carrier 6 facing away from the metallic basic body 12, metallic conductor tracks can be structured via which the light-emitting diode chips 2 connect in parallel on the intermediate carrier 6. The light-emitting diode shown in FIG. 3 is characterized by a simplified manufacturing procedure over the examples shown in FIGS. 1 and 2 since there is no need for application of the electrically insulating layer 5. There is the disadvantage, in contrast to the examples explained in connection with FIGS. 1 and 2, that there is no direct spreading of heat from the light-emitting diode chips 2 into the metallic basic body 12, but the thermal conductivity is reduced by the intermediate carrier 6.

In all of the examples, it is possible far the cover 7 to be provided or dispensed with. The cover 7 can form mechanical protection for the light-emitting diode chips 2 and furthermore exhibit optical properties such as radiation conversion and/or radiation diffusion.

Figure 4:
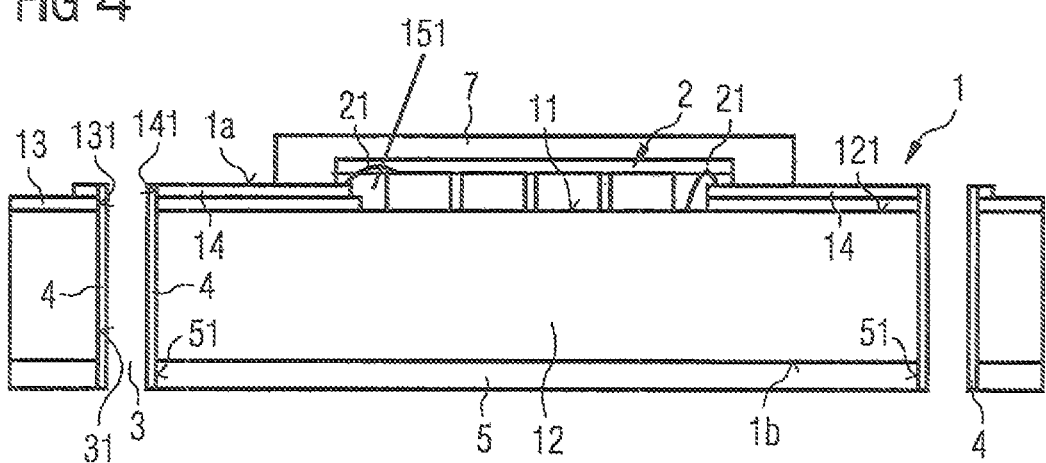

A further example of a light-emitting diode is explained with reference to the schematic sectional illustration shown in FIG. 4. In contrast to the previous examples, the light-emitting diode in this case comprises a reflective coating 151 in which the light-emitting diode chips 2 are embedded. The reflective coating 151 in this case covers the mounting face 11 of the carrier 1 completely. In the example shown in FIG. 4, the light-emitting diode chips 2 protrude with their surfaces facing away from the carrier 1, which represent the radiation exit surfaces of the light-emitting diode chips 2, out of the reflective coating 151. For example, the reflective coating 151 terminates flush with these surfaces. In this case, the reflective coating is formed with a matrix material such as silicone, for example, with radiation-reflecting particles, for example, consisting of titanium dioxide, being introduced into the matrix material.

A reflective coating 151 can be used in this case in all of the examples of the light-emitting diode. For example, in the example shown in FIG. 3, the reflective coating 151 would then also cover the exposed outer face of the intermediate carrier 6 completely.

Our light-emitting diodes are not restricted to the examples by the description relating thereto. Instead, this disclosure includes any novel feature and combination of features which includes in particular any combination of features in the appended claims, even if the feature or combination has not itself been explicitly specified in the claims or examples.

The invention claimed is:

1. A light-emitting diode comprising: a carrier with a mounting face on an upper side of the carrier and at least two light-emitting diode chips affixed to the carrier at the mounting face, wherein the carrier comprises a metallic basic body, an electrically insulating layer affixed to the metallic basic body on the side facing the light-emitting diode chips, and an electrically conductive layer formed directly on the electrically insulating layer, the light-emitting diode chips electrically conductively connected to the electrically conductive layer, the light-emitting diode chips also connected in parallel with one another via the metallic basic body, a further electrically insulating layer is affixed to the carrier on a lower side of the carrier opposite to the upper side of the carrier, and the further electrically insulating layer has a thermal conductivity of at least 2 W/(mK), at least one opening in the carrier extending from the upper side of the carrier to the lower side of the carrier, wherein the at least one opening passing through the carrier completely, and an inner face of the at least one opening being also covered by the further electrically insulating layer; and the at least one opening provided to accommodate a fixing device to mount the light-emitting diode.

2. The light-emitting diode according to claim 1, wherein the electrically insulating layer is a ceramic layer.

3. The light-emitting diode according to claim 1, wherein the electrically insulating layer has a thickness of 30 µm to 100 µm.

4. The light-emitting diode according to claim 1, wherein the electrically insulating layer consists of a ceramic material.

5. The light-emitting diode according to claim 1, wherein the electrically insulating layer contains boron nitride or consists of boron nitride.

6. The light-emitting diode according to claim 1, wherein the metallic basic body accounts for at least 90% of the volume of the carrier.

7. The light-emitting diode according to claim 1, wherein the metallic basic body accounts for at least 90% of the weight of the carrier.

8. The light-emitting diode according to claim 1, wherein:
the at least two light-emitting diode chips are embedded in a reflective coating which covers the mounting face and side faces of the light-emitting diode chips, and
the light-emitting diode chips protrude with their radiation exit surfaces out of the reflective coating, wherein the radiation exit surfaces face away from the carrier.

9. The light-emitting diode according to claim 8, wherein the reflective coating appears white under daylight.

10. The light-emitting diode according to claim 1, wherein:
the at least two light-emitting diode chips are embedded in a reflective coating which covers the mounting face and side faces of the light-emitting diode chips, and the reflective coating terminates flush with radiation exit surfaces of the light-emitting diode chips facing away from the carrier.

* * * * *